(12) United States Patent
Shapiro et al.

(10) Patent No.: US 10,942,212 B2
(45) Date of Patent: Mar. 9, 2021

(54) SYSTEM AND METHOD FOR TESTING RADIO FREQUENCY SWITCHES

(71) Applicant: pSemi Corporation, San Diego, CA (US)

(72) Inventors: Eric S. Shapiro, San Diego, CA (US); Tero Tapio Ranta, San Diego, CA (US); William Joseph Jasper, Escondido, CA (US)

(73) Assignee: pSemi Corporation, San Diego, CA (US)

( * ) Notice: Subject to any disclaimer, the term of this patent is extended or adjusted under 35 U.S.C. 154(b) by 182 days.

(21) Appl. No.: 16/211,004

(22) Filed: Dec. 5, 2018

(65) Prior Publication Data
US 2020/0182924 A1 Jun. 11, 2020

(51) Int. Cl.
*G01R 31/26* (2020.01)
*G01R 31/327* (2006.01)

(52) U.S. Cl.
CPC ..... *G01R 31/2621* (2013.01); *G01R 31/3277* (2013.01)

(58) Field of Classification Search
CPC ............ G01R 31/2621; G01R 31/2623; G01R 31/2625; G01R 31/2626; G01R 31/2628; G01R 31/327; G01R 31/3277; G01R 31/2822
See application file for complete search history.

(56) References Cited

U.S. PATENT DOCUMENTS

| | | | |
|---|---|---|---|
| 4,517,622 A | 5/1985 | Male | |
| 7,755,379 B2* | 7/2010 | Lui | G01R 31/2621 |
| | | | 324/762.09 |
| 9,024,700 B2 | 5/2015 | Ranta | |
| 9,197,194 B2 | 11/2015 | Reedy et al. | |
| 9,213,056 B1* | 12/2015 | Tsironis | G01R 1/0491 |
| 10,481,194 B2* | 11/2019 | George | G01R 31/2822 |
| 10,591,530 B1* | 3/2020 | Tsironis | G01R 27/32 |
| 2002/0178827 A1 | 12/2002 | Wang | |

(Continued)

OTHER PUBLICATIONS

Lee, Hun Gil, International Search Report and Written Opinion received from the KIPO dated Jun. 24, 2020 for appln. No. PCT/US2020/019762, 10 pgs.

*Primary Examiner* — Lee E Rodak
*Assistant Examiner* — Feba Pothen
(74) *Attorney, Agent, or Firm* — Jaquez Land Greenhaus LLP; John Land, Esq.

(57) ABSTRACT

Systems and methods for testing radio frequency FET switches at high RF voltages. Embodiments utilize an impedance transformer, or resonator, to step up the available voltage from an RF signal generator and amplifier to a device under test (DUT). The resonator reduces the RF power required to test at higher voltages, resulting in lower cost and other benefits. When a DUT begins to exhibit excessive non-linear distortion, resonance is lost, applied RF test signal power is reflected back as a reflected signal, and current to the DUT is starved by the resonator, protecting the DUT from destructive power levels. Measuring the amplitude of the reflected signal at the harmonic frequencies of the RF test signal allows detection of a harmonic knee point for selected reflected signal harmonics, and consequently allows determination of the power level of the RF test signal at which excessive non-linear distortion occurs.

20 Claims, 12 Drawing Sheets

(56) References Cited

U.S. PATENT DOCUMENTS

| | | |
|---|---|---|
| 2006/0273805 A1 | 12/2006 | Peng et al. |
| 2012/0098598 A1* | 4/2012 | Uno .......................... H03F 1/32 |
| | | 330/277 |
| 2013/0326300 A1* | 12/2013 | Suzuki ................... H03H 11/30 |
| | | 714/735 |
| 2014/0103937 A1* | 4/2014 | Khan ...................... H02S 50/10 |
| | | 324/509 |
| 2014/0260690 A1 | 9/2014 | Corder et al. |
| 2016/0061875 A1* | 3/2016 | Kuo ................... G01R 31/2822 |
| | | 324/537 |
| 2016/0109511 A1* | 4/2016 | Kuo ................... G01R 31/2822 |
| | | 324/750.3 |
| 2016/0341623 A1 | 11/2016 | Paulitsch et al. |

\* cited by examiner

FIG. 2A
(Prior Art)
FIG. 2B
(Prior Art)
Vgs > Vth
Vgs = 0
Device Symbol:
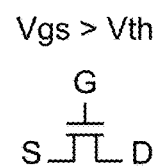
202a
202b
Switch Representation:
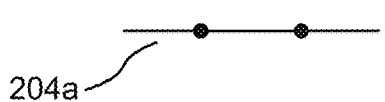
204a
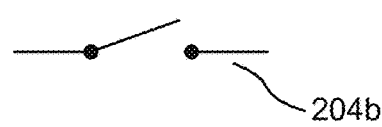
204b
Equivalent Circuit:
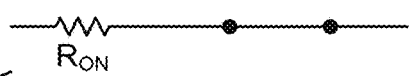
$R_{ON}$
206a
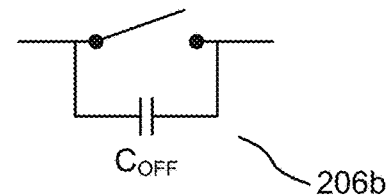
$C_{OFF}$
206b
(1st Order Approximation)
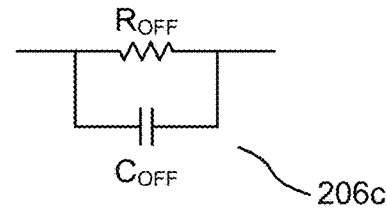
$R_{OFF}$
$C_{OFF}$
206c
(2nd Order Approximation)

Inductor Equivalent Circuit with Parasitic Elements

Inductor Equivalent Circuit with Parasitic & Optional Tuning Elements

PCB with DUT

IC Wafer with DUT

SYSTEM AND METHOD FOR TESTING RADIO FREQUENCY SWITCHES

BACKGROUND

(1) Technical Field

The invention relates to electronic circuits, and more particularly to systems and methods for testing radio frequency electronic switch circuits.

(2) Background

In radio frequency (RF) systems, such as cellular phones and WiFi networks, electronic switch circuits are often used in series with RF signal lines to selectively block or conduct RF signals, such as between an antenna and a transceiver circuit. Electronic switch circuits are also often used in a shunt configuration between an RF signal line and a reference potential (e.g., circuit ground), for example, to selectively isolate nodes of the RF signal line from significantly influencing other circuitry. As one example, FIG. 1 is a schematic circuit of a common prior art series-shunt switch circuit configuration 100. In the illustrated configuration, a series switch circuit 102 is coupled to an RF signal line 104 between an $RF_{IN}$ port and an $RF_{OUT}$ port, and a shunt switch circuit 106 is coupled to the RF signal line 104 between the $RF_{OUT}$ port and circuit ground. Closing the series switch circuit 102 and opening the shunt switch circuit 106 open allows an RF signal to be conveyed from an antenna ANT through $RF_{IN}$ to $RF_{OUT}$. Opening the series switch circuit 102 and closing the shunt switch circuit 106 blocks an RF signal at the antenna ANT from being conveyed through $RF_{IN}$ to $RF_{OUT}$; shunting $RF_{OUT}$ to ground improves isolation.

Ideally, switch circuits such as those shown in FIG. 1 should not appreciably alter or affect an RF signal. However, in integrated circuits, RF switching circuits are generally implemented with transistors, particularly field-effect transistors (FETs), and more particularly MOSFETs. A FET in a conducting (ON) state presents some resistance, $R_{ON}$, to a conducted signal, and in a blocking (OFF) state presents a very high resistance, $R_{OFF}$, to a conducted signal as well as some capacitance, $C_{OFF}$, which may be in series, shunt, or parallel to an RF signal line. Accordingly, FET-based switch circuits generally behave less than ideally in an RF circuit. A further issue with FETs is that the voltage that a single FET can withstand between drain and source without breaking down is generally limited to a few volts. In an electronic system, there may be parts of the system where the voltage that must be withstood far exceeds the voltage handling capability of a single FET. A common solution is to series stack FETs so that the drain-source voltage across any one FET is less than its drain-source breakdown voltage. However, stacking FETs increases the $R_{ON}$ and $C_{OFF}$ of the circuit.

As illustrated in FIG. 1, the series switch circuit 102 and shunt switch circuit 106 are modeled as single-pole, single-throw (SPST) switches, each comprising a stack of FETs. Each of the stacks comprises a plurality of series-coupled FETs M1-Mn (although "n" may differ for the two stacks); gate bias networks, body bias networks, and control circuits are omitted for clarity. In use, the series switch circuit 102 and shunt switch circuit 106 are generally operated in a complementary manner: if series switch circuit 102 is open, then shunt switch circuit 106 is closed, and if series switch circuit 102 is closed, then shunt switch circuit 106 is open.

While the series switch circuit 102 and shunt switch circuit 106 are commonly implemented as FET stacks, they still may be schematically represented as a single FET, such as FET 108 in FIG. 1. Other symbolic representations are commonly used. For example, FIG. 2A shows a FET device 202a in an ON or conducting mode (i.e., Vgs>Vth for an enhancement mode N-channel device), along with a closed switch representation 204a and a first-order equivalent circuit 206a showing the series $R_{ON}$ resistance of the FET device 202a. Similarly, FIG. 2B shows a FET device 202b in an OFF or blocking mode (i.e., Vgs≤Vth for an enhancement mode N-channel device), along with an open switch representation 204b, a first-order approximation of an equivalent circuit 206b showing the parallel $C_{OFF}$ capacitance of the FET device 202b, and a second-order approximation of an equivalent circuit 206c showing the $C_{OFF}$ capacitance of the FET device 202b in parallel with the $R_{OFF}$ resistance of the device.

Switch circuits of the type shown in FIG. 1 are tested for various purposes and at different stages of device fabrication and product integration. One common test is to determine the RF voltage at which a particular FET switch begins to exhibit excessive non-linear distortion, meaning that an applied RF voltage is no longer adequately blocked by the FET switch. Testing at lower RF voltages (e.g., less than about 40V peak, or "40 Vpk") is common, but challenges have arisen with respect to testing at higher RF voltages (e.g., greater than about 40 Vpk, and especially at or above about 100 Vpk). The present invention addresses and solves those challenges.

SUMMARY

The invention encompasses systems and methods for testing radio frequency FET switch circuits at high RF voltages (e.g., greater than about 40 Vpk, and especially at or above about 100 Vpk). To overcome the drawbacks of conventional systems for testing RF FET switches at high RF voltages, embodiments of the present invention utilize an impedance transformer, or resonator, to step up the available voltage of an RF test signal from an RF signal generator and amplifier to a FET switch device under test (DUT). The resonator reduces the RF power required to test at higher voltages, resulting in lower cost, greater practicality, less likelihood of destroying a DUT, and increased safety of personnel. Further, the resonator allows testing of a FET switch under conditions (high impedance, high voltage, and low current) that mirror the intended operating conditions of the switch in an application, such as a cell phone antenna tuning switch.

Of note, in a resonator-based test system, when a DUT begins to exhibit excessive non-linear distortion, resonance is lost, power from an applied RF test signal is reflected back as a reflected signal, and current to the DUT is starved by the resonator, thus protecting the DUT from destructive power levels. Measuring the amplitude of the reflected signal at the harmonic frequencies of the RF test signal, in either a backward or forward direction, allows detection of a harmonic knee point (HKP) for selected reflected signal harmonics, and consequently allows determination of the power level of the RF test signal at which excessive non-linear distortion occurs.

A resonator-based test circuit is easily made from economical components, and is fast, accurate, and scalable. In addition to reducing the power level of the test system (and thus avoiding increased cost), in some embodiments, the resonator-based circuit also raises the voltage level of the reflected signal with respect to the system noise floor, making accurate measurement easier and decreasing test time. Another benefit of a resonator-based test circuit is that it can detect when a DUT is out of specification.

Embodiments of the invention may be used in reliability burn-in systems to stress FET switch devices or accelerate lifetime degradation of FET switch devices under test, as well as for testing of FET switch units as part of normal production.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 2A shows a FET device in an ON or conducting mode (i.e., Vgs>Vth for an enhancement mode N-channel device), along with a closed switch representation and a first-order equivalent circuit showing the $R_{ON}$ resistance of the FET device.

FIG. 2B shows a FET device in an OFF or blocking mode (i.e., Vgs<Vth for an enhancement mode N-channel device), along with an open switch representation, a first-order approximation of an equivalent circuit showing the $C_{OFF}$ capacitance of the FET device, and a second-order approximation of an equivalent circuit showing the $C_{OFF}$ capacitance of the FET device in parallel with the RUFF resistance of the device.

Like reference numbers and designations in the various drawings indicate like elements.

DETAILED DESCRIPTION

The invention encompasses systems and methods for testing radio frequency FET switch circuits at high RF voltages (e.g., greater than about 40 Vpk, and especially at or above about 100 Vpk).

Testing for Peak Voltage Handling Capability of a FET

Figure 1:
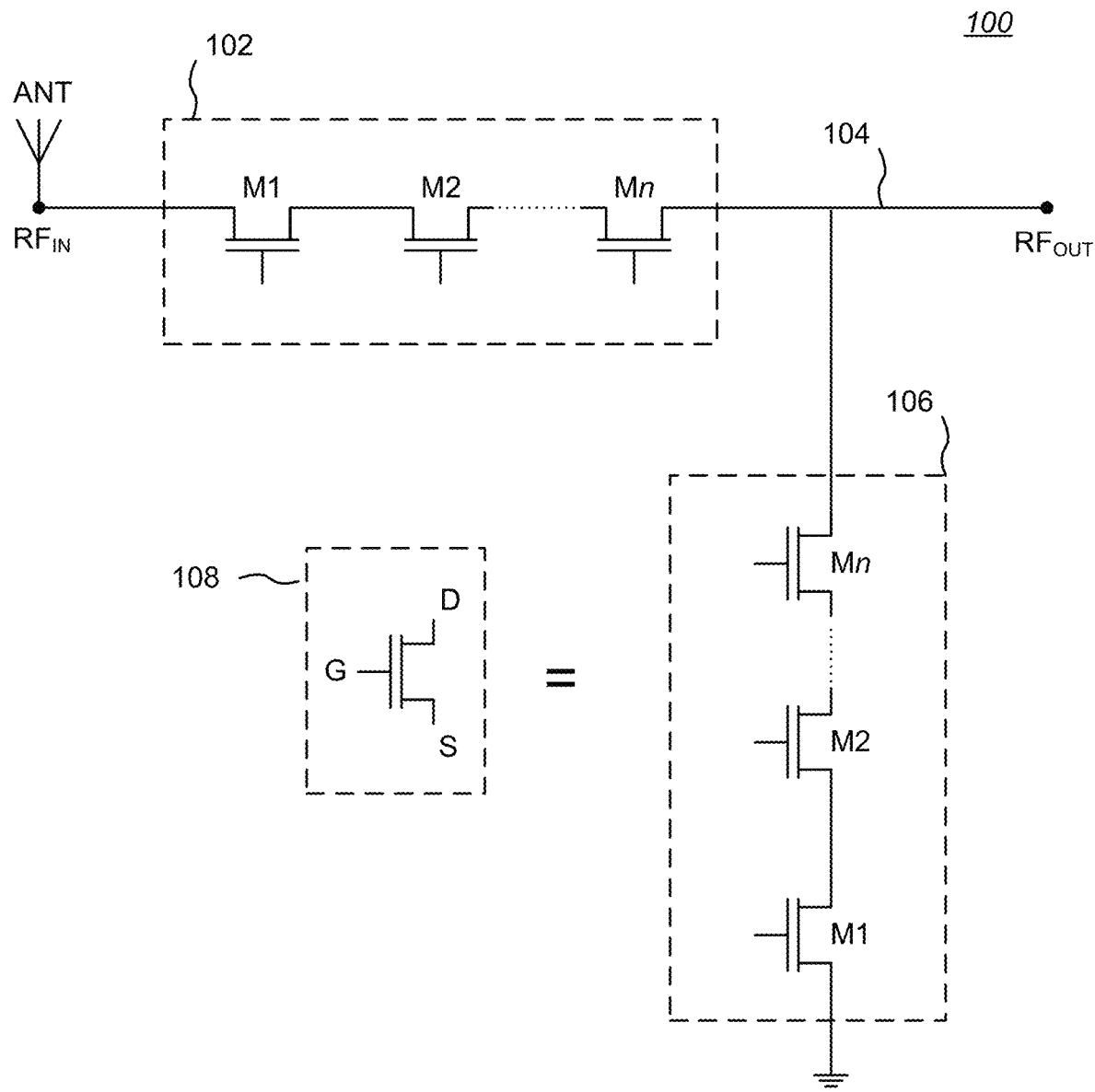
FIG. 1 is a schematic circuit of a common prior art series-shunt switch circuit configuration.

As one example, in some applications, stacked FET switches similar to those shown in FIG. 1 are used as antenna tuner switches and must tolerate high RF voltages when in an OFF state. To test this tolerance, or peak voltage handling capability, it is desirable to measure the voltage at which a device under test (DUT) exhibits excessive non-linear distortion when an RF test signal is applied. Excessive non-linear distortion of a FET switch may be detected as a rapid increase in reflected harmonic power resulting from application of the RF test signal. Testing is generally conducted in an environment having a characteristic impedance that matches the designed characteristic impedance of the DUT (e.g., 50 ohms for modern RF circuitry and systems).

Figure 3:
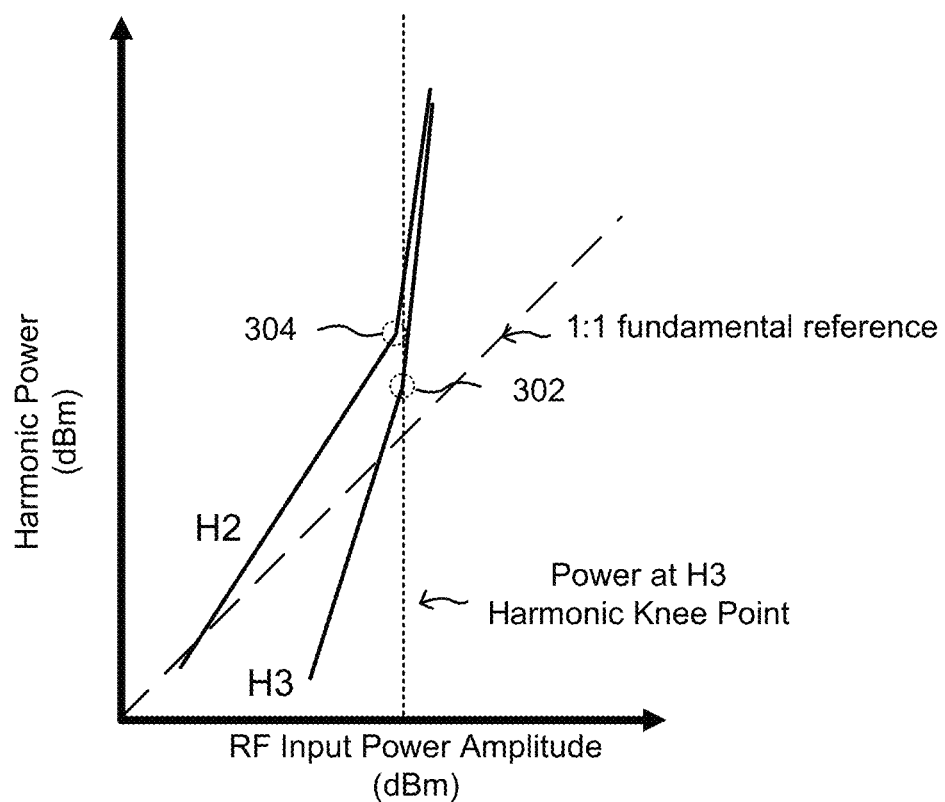
FIG. 3 is a graph showing harmonic power as a function of applied RF input power at a selected frequency (1Fo), such as 800 MHz.

For example, FIG. 3 is a graph showing harmonic power as a function of applied RF input power at a selected frequency (1Fo), such as 800 MHz. Graph line H2 represents the reflected power from the DUT for the second harmonic (2Fo, or 1600 Mhz in this example) of the applied RF test signal. Graph line H3 represents the reflected power from the DUT for the third harmonic (3Fo, or 2400 Mhz in this example) of the applied RF test signal. A dashed reference line at 45° shows that the reflected power for the fundamental frequency (1Fo) is directly proportional to the applied power. Notably, the H2 and H3 graph lines both show a sharp increase in reflected power in the form of inflections (within dotted circles 302, 304) at the input power point where the DUT (i.e., an OFF-state FET switch) begins to conduct, thus signifying excessive non-linear distortion. The inflection points may also be referred to as "harmonic knee points", or HKPs. In a well-behaved system before reaching the HKPs, the H2 graph line changes at a 2:1 dB/dB slope with respect to the fundamental frequency input power, and the H3 graph line changes at a 3:1 dB/dB slope with respect to the fundamental frequency input power. After the HKPs, the slope of both the H2 and H3 graph lines sharply increases. It is desirable to detect the HKPs in order to characterize the voltage at which a DUT exhibits excessive non-linear distortion without the risk of device destruction due to application of excessive power.

In common testing systems at relatively low RF voltage levels (e.g., less than about 40 Vpk), a signal generator applies a variable amplitude RF voltage to an amplifier coupled directly to an OFF-state FET switch as a DUT. Measurement circuitry and/or devices are connected to the DUT to detect the power of reflected harmonics and determine the voltage at which a DUT exhibits excessive non-linear distortion. However, at higher voltages, particularly in excess of about 100 Vpk, it is costly and impractical to apply a high voltage RF test signal to a DUT in a 50 ohm characteristic impedance environment. Simply raising the output voltage of the signal generator/amplifier circuitry is not a good solution, because a FET switch under test may fail quickly and thus conduct a significant amount of current when the HKPs are reached, thereby destroying the DUT. In addition, generating a high RF voltage (e.g., 100 Vpk) in a 50 ohm characteristic impedance system would require a very powerful and large RF power amplifier, which is often impractical. Further, the higher output voltage—meaning more testing points to determine the HKPs—can mean that accurate testing is time consuming. For example, in general, test pulses should be narrow and cool-down time should be allowed for recovery to avoid overheating a DUT; high accuracy increases the number of test points and therefore increases the test time to allow for cool-down.

General Resonator Circuit

To overcome the drawbacks of conventional systems for testing RF FET switches at high RF voltages, embodiments of the present invention utilize an impedance transformer, or resonator, to step up the effective available voltage of an RF test signal from an RF signal generator and amplifier to a FET switch DUT. The resonator reduces the RF power required to test a DUT at higher voltages, resulting in lower cost, greater practicality, less likelihood of destroying the DUT, and increased safety of personnel. Further, the resonator allows testing of a FET switch under conditions (i.e., high impedance, high voltage, and low current) that mirror the intended operating conditions of the switch in many applications, such as a cell phone antenna tuning switch. Additional advantages of the resonator are described below.

Figure 4A:
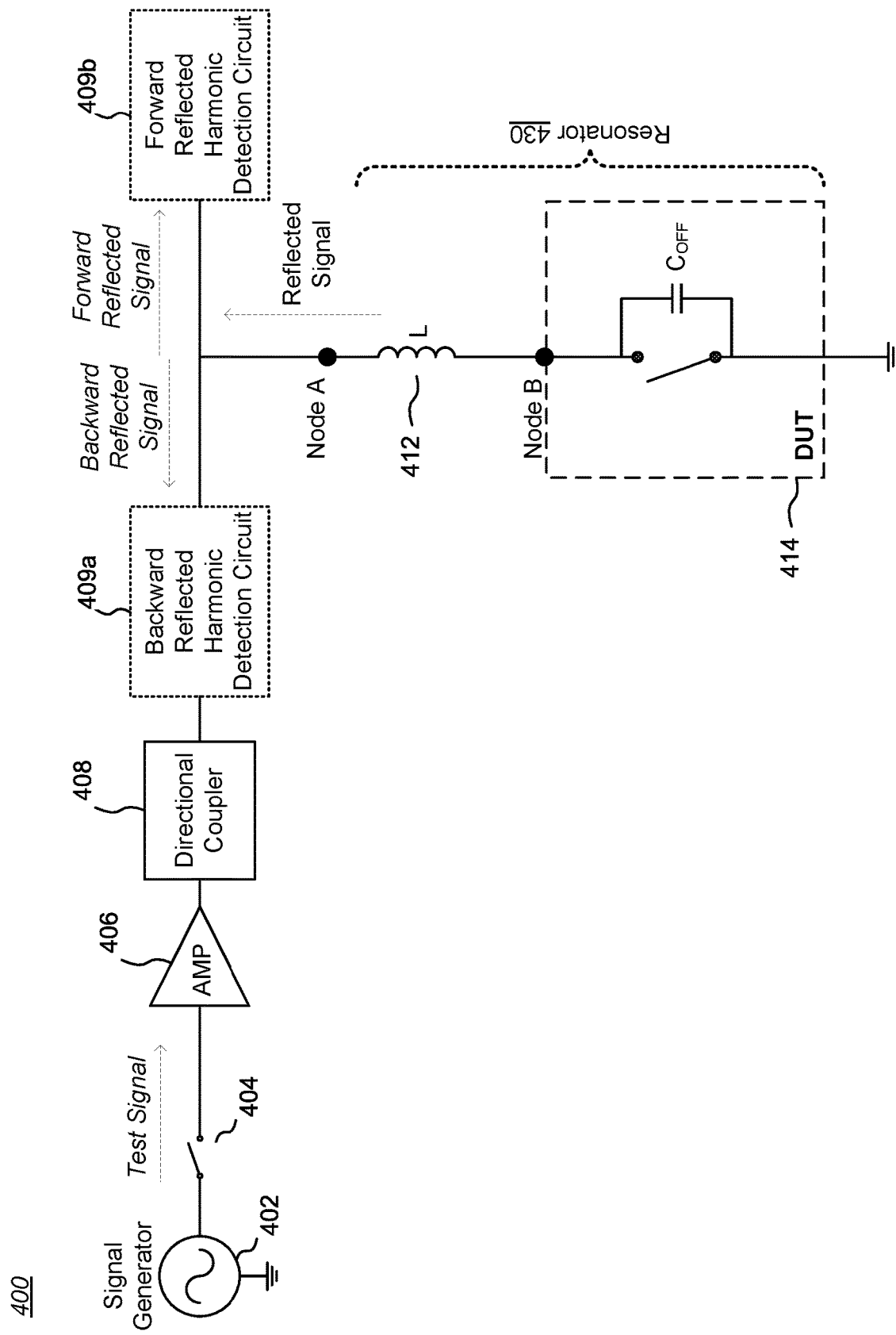
FIG. 4A is a block diagram of a generalized embodiment of the present invention, showing a test system coupled to a device under test.

FIG. 4A is a block diagram of a generalized embodiment 400 of the present invention, showing a test system coupled to a device under test. In the illustrated example, a signal generator 402 is coupled through a digitally controlled switch 404 to a power amplifier 406; in some embodiments, the power amplifier 406 may be integrated into the signal generator 402. The signal generator 402 and power amplifier 406 will generally output an RF test signal (e.g., a sine wave) at a fundamental frequency (e.g., 800 MHz) over a range of amplitudes under program control. The switch 404 allows intermittent passing and blocking of the RF test signal, thus enabling pulsed test signal operation.

In the illustrated example, the output of the power amplifier 406 is coupled through a directional coupler 408 (e.g., a circulator or hybrid coupler) to an inductor 412 coupled to the device under test (DUT) 414, a FET-based switch (shown symbolically in an OFF state as a switch and a parallel capacitor $C_{OFF}$). In one embodiment, the RF test signal from the directional coupler 408 is coupled to the inductor 412 through a backward reflected harmonic detection circuit 409a, described in greater detail with respect to FIG. 4B. In another embodiment, the RF test signal is directly coupled to the inductor 412, which is also coupled to a forward reflected harmonic detection circuit 409b, described in greater detail with respect to FIG. 4C.

Reflected signals from the DUT 414 are filtered and processed in the backward reflected harmonic detection circuit 409a and/or the forward reflected harmonic detection circuit 409b to determine whether the DUT 414 can handle a particular specified peak voltage, and/or to determine the peak voltage at which the DUT 414 exhibits excessive non-linear distortion (i.e., the input power point where the DUT—an OFF-state FET switch—begins to conduct).

The inductor 412 may be implemented as a single inductive device, which may be a discrete inductor component or transmission line (including a phase shifter), or an integrated circuit (IC) structure, such as a planar coil, a microstrip transmission line, or a coplanar waveguide. It may be useful to implement the inductor 412 as at least two series-coupled inductive devices, at least one inductive device having a "coarse" value that is somewhat less than a design goal value, and at least one other inductive device having a "fine" value that allows the design goal value to be more precisely achieved. The inductive devices need not be identical; for example, one inductive device may be a transmission line (discrete or an IC structure), and another inductive device may be a conventional inductor (again, discrete or an IC structure). In some embodiments, a tunable inductor (or equivalent tunable phase shifter, such as a tunable RF transmission line) may be used for the inductor 412 or as a component of the inductor 412 (e.g., as a fine tuning inductive element). Examples of tunable inductors are disclosed in U.S. Pat. No. 9,197,194, issued on Nov. 24, 2015, entitled "Methods and Apparatuses for Use in Tuning Reactance in an Circuit Device", assigned to the assignee of the present invention and hereby incorporated by reference.

The series inductor 412 and the $C_{OFF}$ capacitance of the DUT 414 comprise a resonator 430 that multiplies the voltage of the applied RF test signal at the DUT 414 while reducing the current. The multiplier is the Q factor of the resonator 430. With careful selection of the inductor 412, a Q factor of at least about 10 can be achieved, and some embodiments have exhibited a Q factor of about 20-23. The addition of the inductor 412 to form the resonator 430 steps up the impedance of the signal line after Node A from a lower characteristic impedance (e.g., 50 ohms) to a higher characteristic impedance (e.g., about 200 ohms) at the FET switch stack at Node B. The $C_{OFF}$ capacitance of the DUT 414 completes the impedance transformation to present the higher impedance across the intrinsic FET switch for a select frequency (e.g., 800 MHz). This condition is "resonance" for the selected frequency (since the resonance condition is strictly true only at a single frequency, in practice, it is useful to make measurements at or near the expected resonant frequency). The result of the impedance transformation is that the RF test signal at the DUT 414 is stepped up to a higher voltage—but at a lower current—than is present at the input to the series inductor 412 at Node A.

Figure 5:
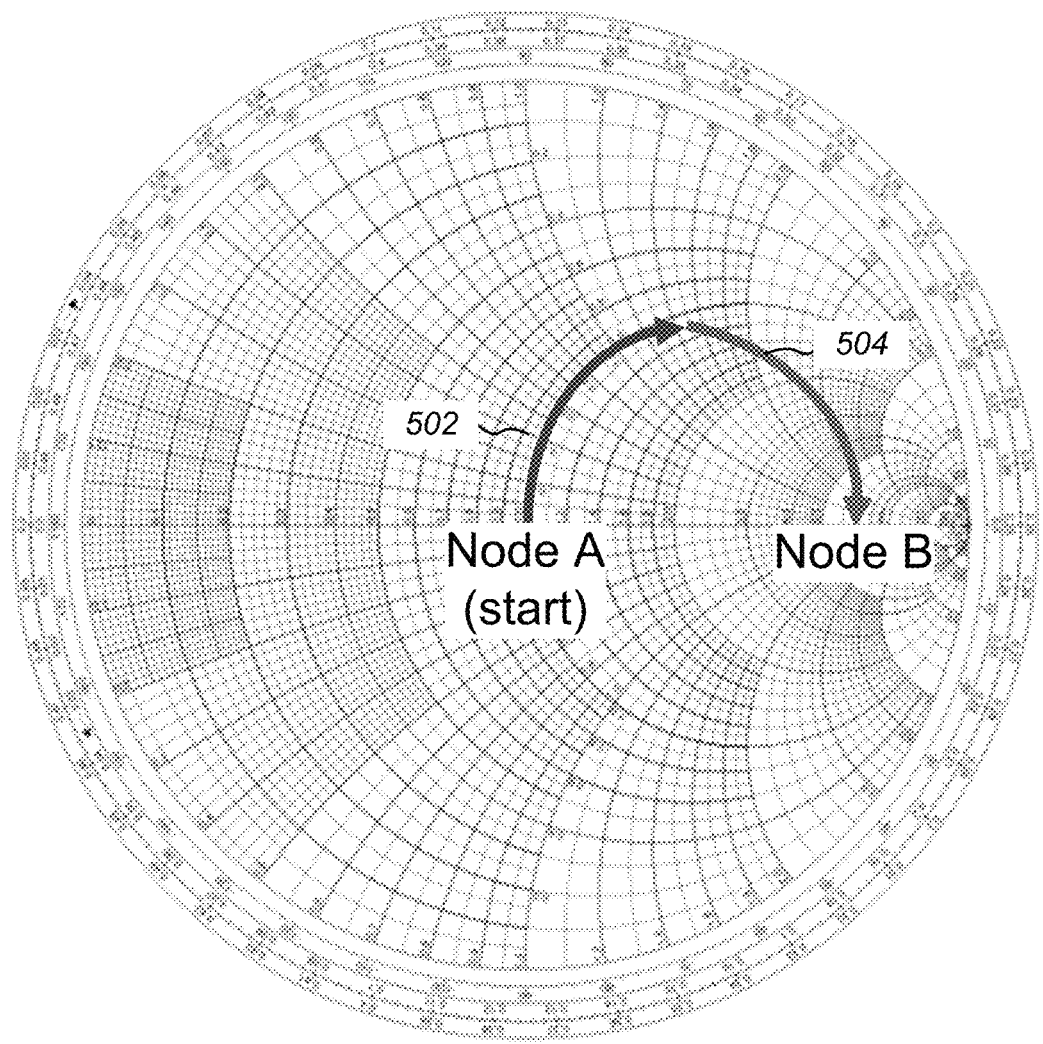
FIG. 5 is a Smith chart that graphically depicts the effect of adding the series inductor to form the resonator of FIG. 4A.

FIG. 5 is a Smith chart 500 that graphically depicts the effect of adding the series inductor 412 to form the resonator 430 of FIG. 4A. Graph line 502 shows the impedance transformation from 50 ohms at Node A resulting from the inductor 412. Graph line 504 shows the impedance transformation to about 200 ohms at Node B resulting from the OFF state capacitance, $C_{OFF}$, of the DUT 414. As the Smith chart 500 shows, the combination of elements results in an impedance transformation: the imaginary components of the reactances of the inductor 412 and of the DUT 414 essentially offset each other, and the real components add together to move from a lower characteristic impedance to a higher characteristic impedance.

Without the resonator 430, the power amplifier 406 would need to output at least about 44 dBm to apply an RF input voltage to the DUT 414 in excess of 100 Vpk (assuming a perfect reflection). However, with a properly configured resonator 430, the required output power of the power amplifier 406 is reduced to about 34 dBm (a significant decrease), while still applying an RF input voltage to the DUT 414 in excess of 100 Vpk.

Of note, in a resonator-based test system, when the DUT 414 begins to exhibit excessive non-linear distortion (i.e., the HKP is reached), resonance is lost, power from an applied RF test signal is reflected back as a reflected signal, and current to the DUT 414 is starved by the inductor 412, thus protecting the DUT 414 from destructive power levels. Measuring the amplitude of the reflected signal at the harmonic frequencies of the RF test signal, in either a backward or forward direction, allows detection of the HKPs for selected reflected signal harmonics, and consequently allows determination of the power level of the RF test signal at which excessive nonlinear distortion occurs.

Backward Reflected Harmonic Detection Circuit

Figure 4B:
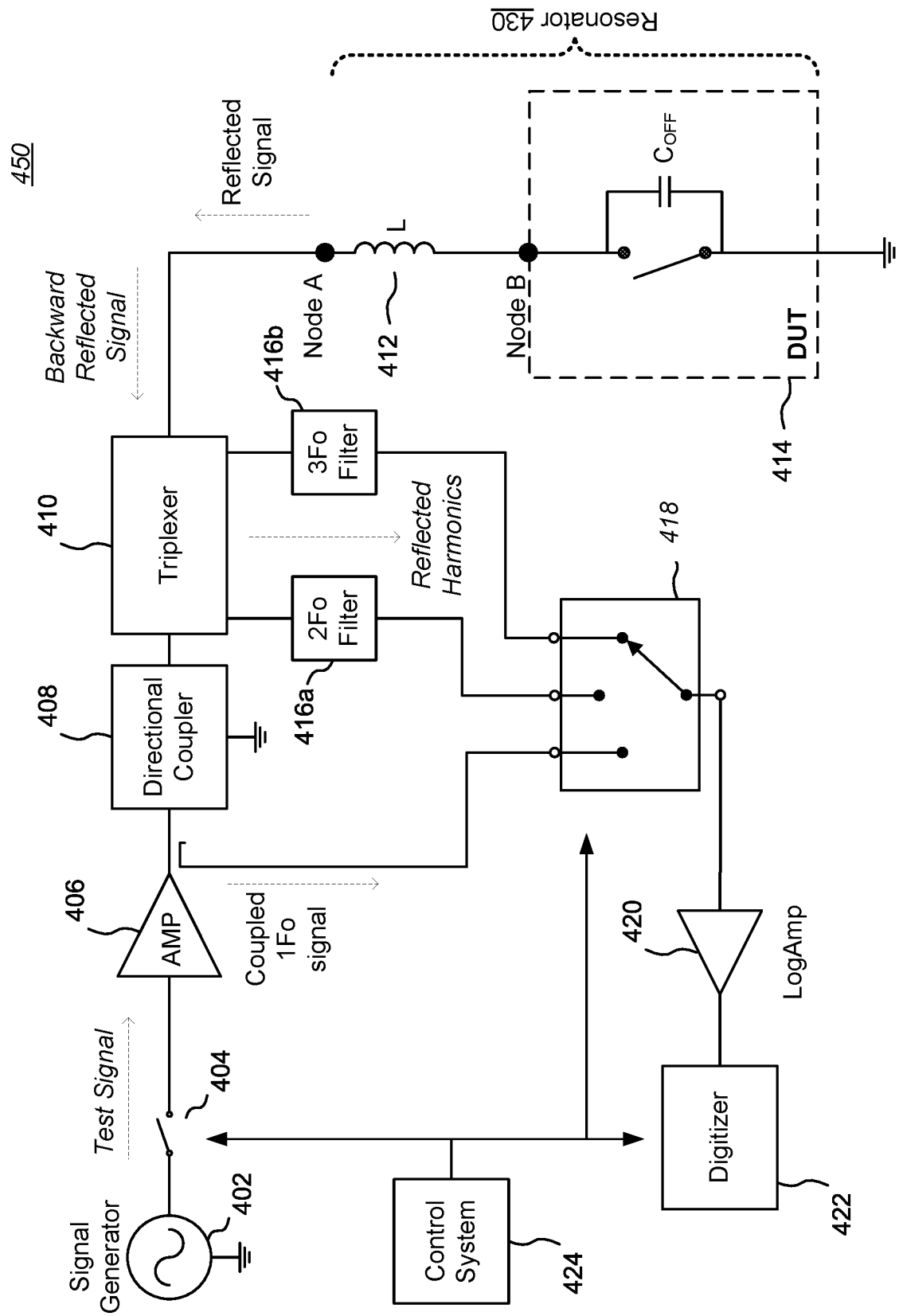
FIG. 4B is a block diagram of a generalized embodiment of the present invention, showing a test system coupled to a device under test through a more detailed implementation of a backward reflected harmonic detection circuit.

FIG. 4B is a block diagram of a generalized embodiment 450 of the present invention, showing a test system coupled to a device under test through a more detailed implementation of a backward reflected harmonic detection circuit. In the illustrated example, the output of the power amplifier 406 is coupled through the directional coupler 408 to a triplexer 410 (shown with only two output ports; a third output port exists that normally would be coupled to a 50 ohm termination load). The triplexer 410 allows the fundamental frequency of the RF test signal to propagate through to an inductor 412 coupled to the device under test (DUT) 414. Backward-directed reflected signals from the DUT 414 are passed by the triplexer 410 to a filter 416a for the reflected power of the second harmonic of the RF test signal (e.g., 1600 MHz), and to a filter 416b for the reflected power of the third harmonic of the RF test signal (e.g., 2400 MHz). In general, it may not always be clear which harmonic will "inflect" first, and thus sampling the reflected power of both the second and third harmonics is useful to avoid possible exposure of a DUT to higher energy. However, in some embodiments, only one harmonic may need to be sampled, and consequently a diplexer may be used in place of the triplexer 410 and only a single harmonic filter is needed. Further, in some embodiments, it may be useful to provide signal redirection and filters for one or more higher order harmonics (fourth, fifth, etc.) for detection of HKPs.

In the illustrated example of FIG. 4B, the outputs of the filters 416a, 414b, as well as a coupled portion of the fundamental RF test signal, are selectively directed by a digitally-controlled multi-port switch 418 to a logarithmic amplifier ("LogAmp") 420. The output of the LogAmp 420 is a voltage Vout that is a proportional to K times the log (natural or log 10) of an input voltage Vin, where K is a scale factor. A logarithmic amplifier is fast with high dynamic range, and thus quite useful in a test system. The output of the LogAmp 420 is coupled to a digitizer 422, which converts the analog output of the LogAmp 420 into digital values. The digital values output by the digitizer 422 can be examined programmatically in a computer (not shown) to determine the HKPs of a device under test, as is known in the calibration field. The digitizer 422 may be synchronized to capture an entire test sequence for post processing. A control system 424, such as a digital vector word generator, may be used to orchestrate the test sequence by providing fast and precise pulse control for the digitizer 422 and the switches 404, 418. The switches 404, 418 are preferably solid-state switches for speed of operation. In some embodiments, the multi-port switch 418 also connects a termination or load to ports that are de-selected, which gives connected filters and couplers a proper load (e.g., 50 ohms) for all states of the multi-port switch 418.

Backward Reflected Harmonic Detection Circuit

Figure 4C:
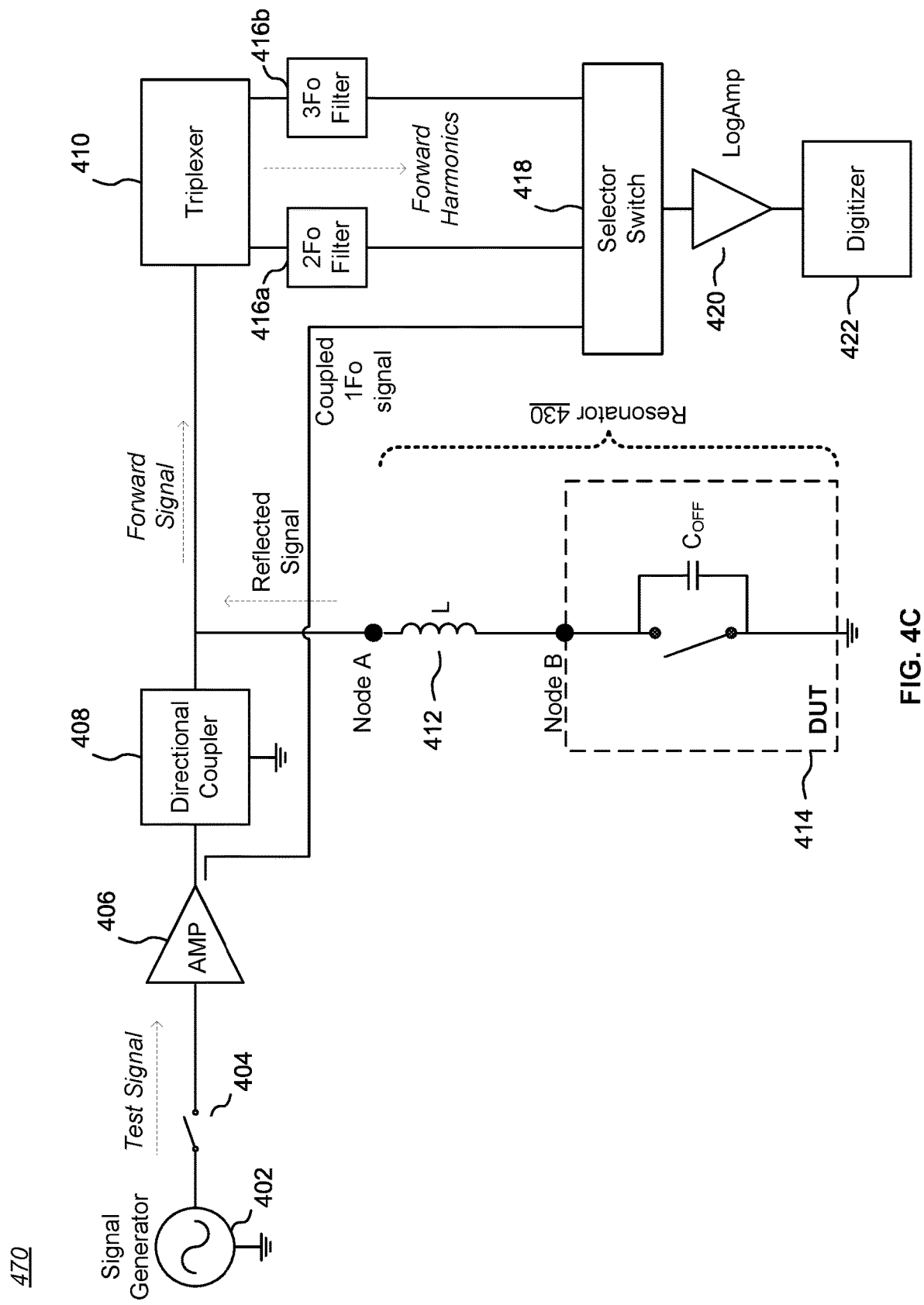
FIG. 4C is a block diagram of a generalized embodiment of the present invention, showing a test system coupled to a device under test through a more detailed implementation of a forward reflected harmonic detection circuit.

FIG. 4C is a block diagram of a generalized embodiment 470 of the present invention, showing a test system coupled to a device under test through a more detailed implementation of a forward reflected harmonic detection circuit. Essentially, a test signal is directly coupled to the inductor 412 through the directional coupler 408, and reflected signals from the DUT 414 are coupled to a triplexer 410 as a forward reflected signal (again the triplexer 410 is shown with only two output ports; a third output port exists that normally would be coupled to a 50 ohm termination load). Thereafter, the forward reflected signal is coupled to a filter 416a for the reflected power of the second harmonic of the RF test signal (e.g., 1600 MHz), and to a filter 416b for the reflected power of the third harmonic of the RF test signal (e.g., 2400 MHz). As with the example of FIG. 4B, in some embodiments, only one harmonic may need to be sampled, and in some embodiments, it may be useful to provide signal redirection and filters for one or more higher order harmonics (fourth, fifth, etc.) for detection of HKPs.

In the illustrated example of FIG. 4C, the outputs of the filters 416a, 414b, as well as a coupled portion of the fundamental RF test signal, are selectively directed by a digitally-controlled multi-port switch 418 to a LogAmp 420. The output of the LogAmp 420 is coupled to a digitizer 422, which converts the analog output of the LogAmp 420 into digital values. The digital values output by the digitizer 422 can be examined programmatically in a computer (not shown) to determine the HKPs of a device under test, as is known in the calibration field. The digitizer 422 may be synchronized to capture an entire test sequence for post processing in conjunction with a control system (not shown to avoid clutter, but similar to the control system 424 of FIG. 4B). In some embodiments, the multi-port switch 418 also connects a termination or load to ports that are de-selected, which gives connected filters and couplers a proper load (e.g., 50 ohms) for all states of the multi-port switch 418.

Note that the resonator 430 should generally be measured as a load in and of itself, as shown in FIG. 4B. For the embodiments shown in FIG. 4A (for a forward reflected harmonic detection circuit 409b configuration) and in FIG. 4C, the forward reflected harmonic detection circuit 409b or the triplexer 410 preferably would need to have a very high input impedance so that the load to the system (the DUT) is primarily the resonator 430. However, even if the forward reflected harmonic detection circuit 409b or the triplexer 410 had in input impedance of 50 ohms, the incident power would be shared and divided between the resonator 430 and the forward reflected harmonic detection circuit 409b or the triplexer 410 before the HKP point, and thus the circuits could still detect an HKP point.

Note that the resonator 430 should generally be measured as a load in and of itself, as shown in FIG. 4B. For the embodiments shown in FIG. 4A (for a forward reflected harmonic detection circuit 409b configuration) and in FIG. 4C, the forward reflected harmonic detection circuit 409b or the triplexer 410 preferably would need to have a very high input impedance so that the load to the system (the DUT) is primarily the resonator 430. However, even if the forward reflected harmonic detection circuit 409b or the triplexer 410 had in input impedance of 50 ohms, the incident power would be shared and divided between the resonator 430 and the forward reflected harmonic detection circuit 409b or the triplexer 410 before the HKP point, and thus the circuits could still detect an HKP point.

Variations and Practical Concerns

While the illustrated circuits of FIG. 4B and FIG. 4C shows a multi-port switch 418 to a single measurement circuit comprising the LogAmp 420 and digitizer 422, the multi-port switch 418 may be omitted if individual measurement circuits are connected to the signal pathways comprising the outputs of the filters 416a, 414b, and the coupled portion of the fundamental RF test signal. Further, while the signal generator 402 and power amplifier 406 are shown coupled to a single test path (e.g., the directional coupler 408, triplexer 410, inductor 412, and DUT 414 in the embodiment of FIG. 4B), the RF test signal from the signal generator 402 and power amplifier 406 may be applied to an RF splitter circuit and provided to multiple similar test paths, each with corresponding signal pathways and measurement circuits. In alternative embodiments, other detection and measurement circuits or devices may be used in lieu of, or in addition to, the LogAmp 420 and digitizer 422, such as a spectrum analyzer or power meter.

Figure 6A:
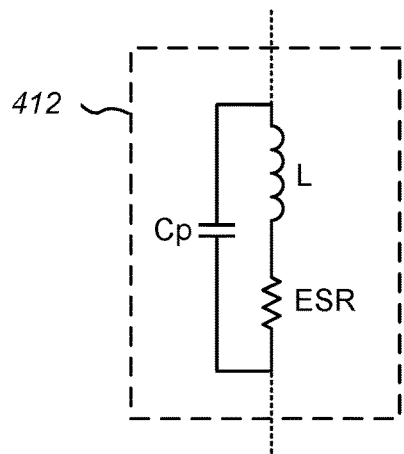
FIG. 6A is a schematic circuit of an equivalent circuit for a practical inductor L, showing an ESR and a parallel parasitic capacitance Cp.

For increased accuracy, it may be necessary to take into account practical matters relating to the inductor 412 and the DUT 414. For example, actual inductors present a resistance to current flow, in contrast to ideal inductors. Thus, the inductor 412 includes an equivalent series resistance (ESR). The ESR of typical inductors at 800 MHz may be surprisingly high (e.g., about 10-20 ohms, depending on the type and high value of inductor used). In addition, an inductor L generally has a parallel parasitic capacitance Cp that results from fabrication of the inductor near conductive components, or due to self-inductance (e.g., as is the case with a helical or coiled inductor). As one example, FIG. 6A is a schematic circuit of an equivalent circuit for a practical inductor L, showing an ESR and a parallel parasitic capacitance Cp. As noted above, the FET switch comprising the DUT 414 has a large $R_{OFF}$ value (e.g., about 15,000 ohms). Further, conductive circuit lines, wires, or traces connecting components may contribute additional impedances. Thus, a more accurate model of the resonator 430 will take into account the RLC characteristics of the resonator 430 elements as a whole. Indeed, it has been found that the ESR of the inductor 412 can help provide the power amplifier 406 and directional coupler 408 with a better load impedance. For example, in one embodiment similar to the circuit of FIG. 4B and configured for a characteristic impedance of 50 ohms, the ESR resistance of a physical inductor helps produce close to a 50 ohm load impedance to the power amplifier 406 (i.e., the series equivalent of the DUT 414 RUFF plus the ESR of the inductor 412 should ideally be equal to 50 ohms). Stated another way, the resonator 430 itself does not transform impedance to 50 ohms, but only transforms the almost-open circuit of the DUT 414 (i.e., high impedance) ideally to essentially short-circuit (i.e., a few ohms). It is the ESR losses that make the resonator 430 actually look like 50 ohms, and the inductance L of the inductor 412 just cancels out the $C_{OFF}$ capacitance of the DUT 414. The ESR thus behaves as a "series resonance" which leaves the real parts of the impedances as the load, at the resonance frequency.

Figure 6B:
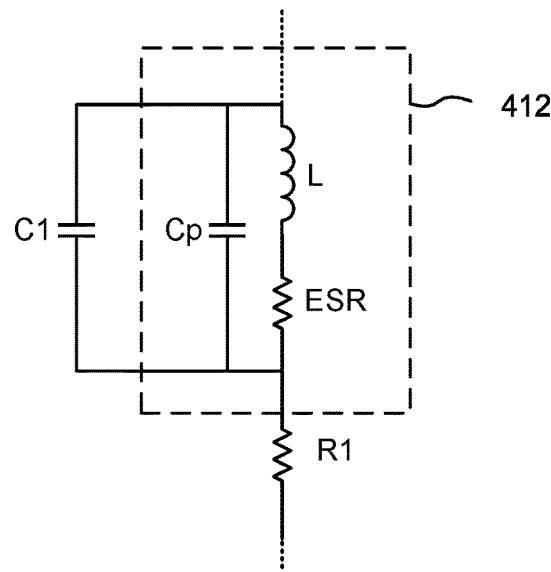
FIG. 6B is a schematic circuit of an equivalent circuit for a practical inductor L, showing an ESR and a parallel parasitic capacitance Cp, along with optional tuning elements.

In some embodiments, it may be useful to add a tuning capacitor to the resonator 430. For example, FIG. 6B is a schematic circuit of an equivalent circuit for a practical inductor L, showing an ESR and a parallel parasitic capacitance Cp, along with optional tuning elements. To tune the characteristic impedance of the resonator 430 for the harmonic reflected signals, a tuning capacitor C1 may be added in parallel with the inductor 412. In some embodiments, the tuning capacitor C1 may be a digitally tunable capacitor (DTC), examples of which may be found in U.S. Pat. No. 9,024,700, issued on May 5, 2015, entitled "*Method and Apparatus for use in Digitally Tuning a Capacitor in an Integrated Circuit Device*", assigned to the assignee of the present invention and hereby incorporated by reference.

While the ESR will limit oscillations in the resonator 430 to an extent, an additional tuning resistor R1 in series with the inductor 412 may be included to intentionally lower the Q factor either to target a specific ratio or to provide a better load impedance at Node A at the fundamental frequency; ideally, R1+ESR(L)+ESR(DUT)=50 ohms. The additional tuning resistor R1 may be a variable or settable resistor having a value set at the time of manufacture or periodically, or may be a digitally tunable resistor.

In some configurations, particularly for sampling or characterization, the DUT 414 may be mounted on a printed circuit board (PCB) or the like. In such configurations, the inductor 412 may also be mounted on the PCB to minimize the length of connecting conductors, which typically add parasitic resistance/inductance/capacitance (RLC) values to the circuit. For other configurations, such as production test systems, the inductor 412 is generally a part of the measurement system, such as a test probe.

Figure 7A:
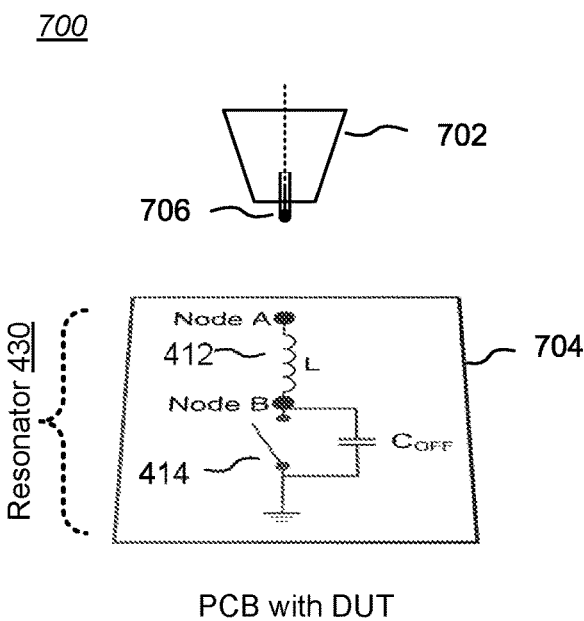
FIG. 7A is a stylized view of a test probe and a printed circuit board (PCB) bearing a DUT.

More particularly, in some embodiments, it may be useful to situate the inductor 412 in close proximity to the DUT 414 to reduce parasitic RLC influences that may affect measurement results. For example, FIG. 7A is a stylized view 700 of a test probe 702 and a printed circuit board (PCB) 704 bearing a DUT 414. The test probe 702 is coupled to a backward reflected harmonic detection circuit 409*a* or to a forward reflected harmonic detection circuit 409*b* (not shown). In this embodiment, the inductor 412 is fabricated on the PCB 704 such that the inductor 412 and the DUT 414 form a resonator 430. A probe contact/tip 706 of the test probe 702 may be touched to Node A on the PCB 704 (e.g., a test point, circuit trace, or terminal coupled through the inductor 412 to the FET switch DUT 414; see also FIGS. 4A-4C) to test the DUT 414, as described above.

Figure 7B:
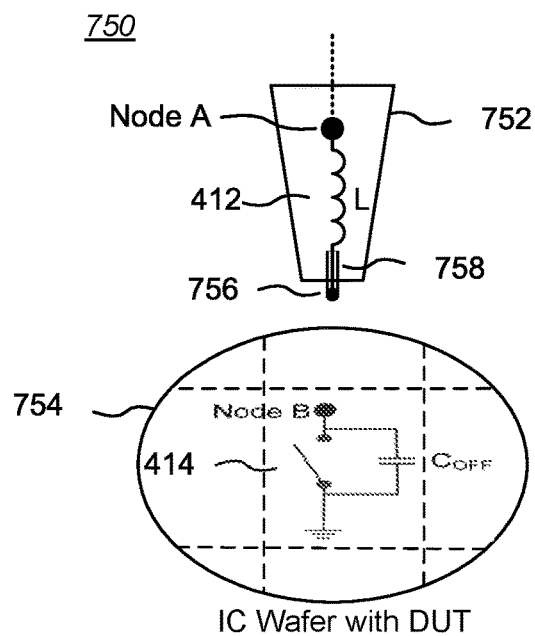
FIG. 7B is a stylized view of a test probe and an integrated circuit wafer bearing one or more DUTs.

As another example, FIG. 7B is a stylized view 750 of a test probe 752 and an integrated circuit wafer 754 bearing one or more DUTs 414. The test probe 702 is coupled to a backward reflected harmonic detection circuit 409*a* or to a forward reflected harmonic detection circuit 409*b* (not shown). The integrated circuit wafer 754 would typically include many instances of a FET switch DUT 414, some or all of which may be tested for the voltage at which they exhibit excessive non-linear distortion characteristics. The illustrated test probe 752 is designed to include an inductor 412 coupled in close proximity to a probe contact or tip 756, connected by a short conductor 758. The short conductor 758 may be, for example, a transmission line. When the probe contact/tip 756 is touched to Node B on the PCB 704 (e.g., a test point, circuit trace, or terminal coupled to the FET switch DUT 414; see also FIGS. 4A-4C), the resonator 430 is complete.

Examples of Performance Characteristics

Figure 8A:
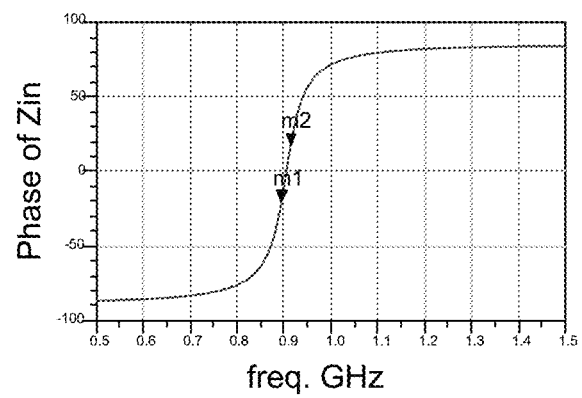
FIG. 8A is a graph of the phase of Zin for the modeled circuit versus frequency.
Figure 8B:
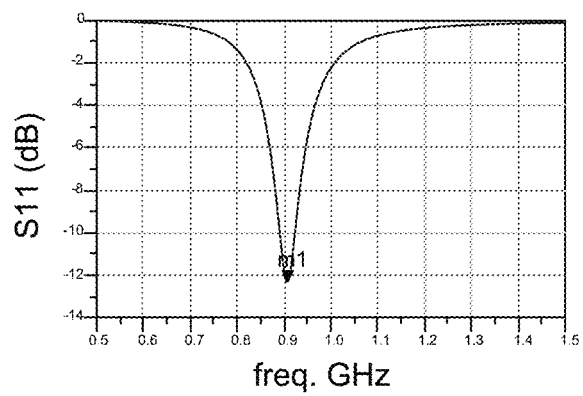
FIG. 8B is a graph of S11 for the modeled circuit versus frequency.
Figure 8C:
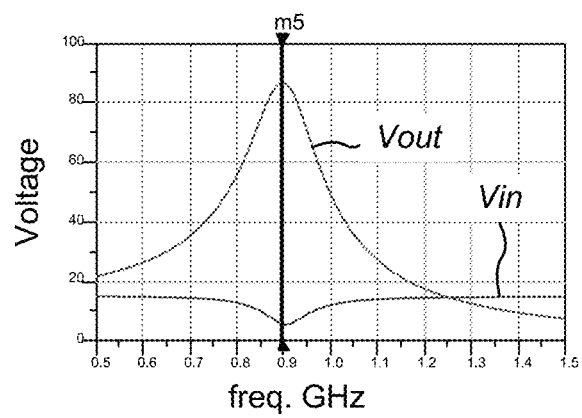
FIG. 8C is a graph of the absolute Vin and Vout voltages for the modeled circuit versus frequency.

FIGS. 8A-8C are graphs illustrating various parameters of a modeled circuit in which an RF test signal is applied to an inductor L (representing the inductor 412 of FIG. 4A) series coupled to a capacitor C (representing the $C_{OFF}$ of the FET switch device under test in FIG. 4A). The series-coupled inductor and capacitor comprise a resonator circuit. In the model, an input voltage Vin is applied to the inductor L, and an output voltage Vout is measured between the inductor L and the capacitor C (i.e., at the input to the capacitor C). The model takes into account the existence of a small transmission line impedance Z between the inductor L and the capacitor C.

FIG. 8A is a graph of the phase of Zin for the modeled circuit versus frequency. The phase of Zin can be calculated from the S11 scattering parameter for the modeled circuit as Zin=Z0*(1+S11)/(1−S11). The phase of Zin can be used to compute the Q factor of the resonator circuit based on its rate of change: the Q @ resonance=ResonantFrequency*Slope@resonance (the slope should be expressed as radians/frequency so that Q is unitless). In the illustrated example, the data point m1 indicates a phase of about −20.12 at about 896 MHz, and the data point m2 indicates a phase of about +18.37 at about 916 MHz.

FIG. 8B is a graph of S11 for the modeled circuit versus frequency. In the illustrated example, the data point m1 indicates a dip in the S11 measurement at resonance for the resonator circuit (about 907 MHz in this example).

FIG. 8C is a graph of the absolute Vin and Vout voltages for the modeled circuit versus frequency. In the illustrated example, the nominal value for Vin is about 18V, but dips down to about 8V at the resonance frequency for the resonator circuit (again, about 907 MHz in this example). In this example, Vin dips because the input impedance at resonance is not 50 ohms, which affects the transfer of voltage from a RF signal generator 402 having a 50 ohm output impedance to the load (i.e., the resonator 430) by way of voltage division. In contrast, owing to the impedance transformation of the resonator circuit, Vout is at about 85V at resonance. Accordingly, in this example, the step-up ratio of Vin/Vout is about 10 at resonance.

Operational Testing

Referring to the embodiments illustrated in FIGS. 4B-4C, in operation, a DUT 414 is coupled to the inductor 412, and an RF test signal is applied at a selected frequency 1Fo (e.g., 800 MHz) through the inductor 412 to the DUT 414. The forward power of the RF test signal is increased in a step-wise or continuous manner while measurements of 1Fo (i.e., the coupled portion of the forward power of the RF test signal) and at least one of the harmonic frequencies 2Fo and 3Fo in the reflected signal (e.g., 1600 MHz and 2400 MHz) are made based on the digital values output by the digitizer 422. The peak voltage handling capability for the DUT 414 is determined as the forward power level of the RF test signal that causes a sharp increase (i.e., an inflection or HKP) in the reflected harmonics, as described above.

Note that in production testing, a DUT 414 may pass a specified peak voltage handling capability even if an HKP is not detected. For example, of a specification requires that a DUT must have a peak voltage handling capability of 100 Vpk, and a particular DUT can actually withstand a higher peak voltage (e.g., 110 Vpk), then that part will pass testing even though no HKP is detected, since testing stops at 100 Vpk.

For non-destructive testing of a FET switch device, it has been found useful to apply the forward power from the power amplifier 406 in pulses to avoid overheating the DUT 414. In one embodiment, an RF test signal pulse duration of about 70 μs duration (with a 1% duty cycle, allowing search iterations of about 7 ms) has been found satisfactory. In one embodiment of the configuration shown in FIG. 4B, during application of the forward power pulses, the coupled forward signal 1Fo and the 2Fo and 3Fo harmonics from the reflected signal are sequentially cycled through the multi-port switch 418 and applied to the LogAmp 420. The output of the LogAmp 420 is sampled by the digitizer 422 with a resolution of about 250 ns. To improve repeatability, sample averaging may be employed (e.g., 40 data points per frequency sampling cycle).

Figure 9:
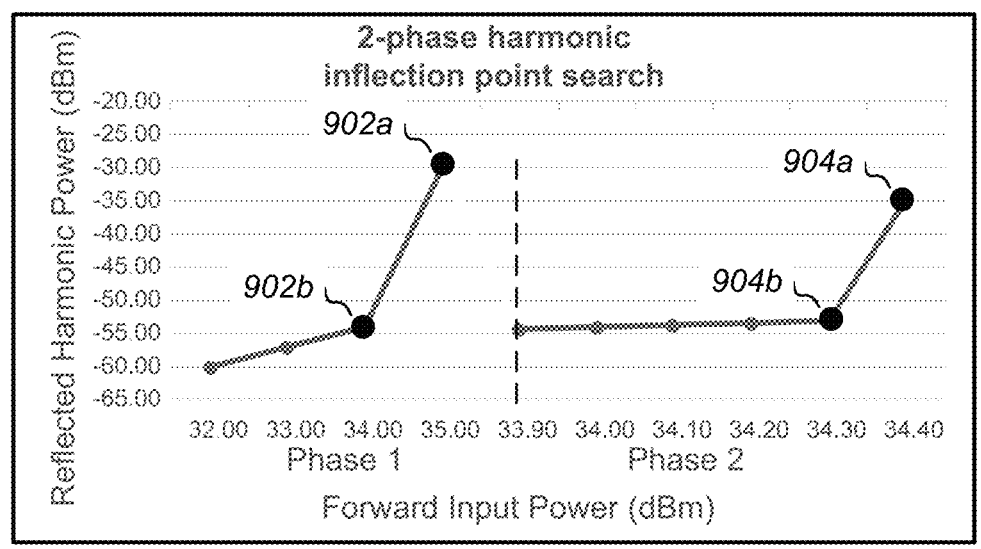
FIG. 9 is graph of reflected harmonic power for the 3Fo harmonic frequency versus forward input power for a test system of the type shown in FIG. 4B, for a particular FET switch device under test.

For fast but accurate testing, it has also been found useful to split testing of a DUT 414 into two iterative phases. For example, FIG. 9 is graph of reflected harmonic power for the 3Fo harmonic frequency versus forward input power for a test system of the type shown in FIG. 4B, for a particular FET switch device under test. In a first phase of testing, starting at a safe level that should not exceed the voltage at which the DUT would exhibit excessive non-linear distortion (e.g., 32.0 dBm in the illustrated example), the forward power of the RF test signal is increased at a first rate, such as 1.0 dBm steps in the illustrated example. The sharp increase in the reflected harmonic power between node 902a at 34.0 dBm of forward input power and node 902b at 34.0 dB of forward input power indicates that the HKP voltage for the DUT occurs somewhere in the range bracketed by node 902a and node 902b. This results in a first approximation for the HKP as being somewhere between 34.0 dBm and 35.0 dBm.

In a second phase of testing, the forward power of the RF test signal is increased at a second and lesser rate (such as 0.1 dBm steps in the illustrated example), starting from a level just below the range of forward input power levels determined in the first phase where the DUT exhibits excessive non-linear distortion; in this example, phase 2 starts at 33.9 dBm. The sharp increase in the reflected harmonic power between node 904a at 34.3 dBm of forward input power and node 904b at 34.4 dB of forward input power indicates that the HKP voltage for the DUT occurs somewhere in the range bracketed by node 904a and node 904; generally, the lesser value of 34.3 dBm would be assigned as the voltage of the HKP. This methodology yields a more precise second approximation for the HKP voltage. In the illustrated example, two-phase HKP searching results in a resolution of 0.1 dBm (approximately 1V) and is repeatable to less than about 0.1 dBm.

In this example, a quite precise HKP voltage for a DUT can be found in 4 steps of first phase testing, and 6 steps of second phase testing, for a total of 10 measurements. In contrast, if testing at a similarly resolution (0.1 dBm) where to begin at the same starting point (32.0 dBm), a total of 24 measurements would have been needed to reach the 34.4 dBm level indicating the HKP voltage of the DUT. The difference in testing time is significant, particularly in production testing of thousands of parts.

Auxiliary Circuits

Figure 10:
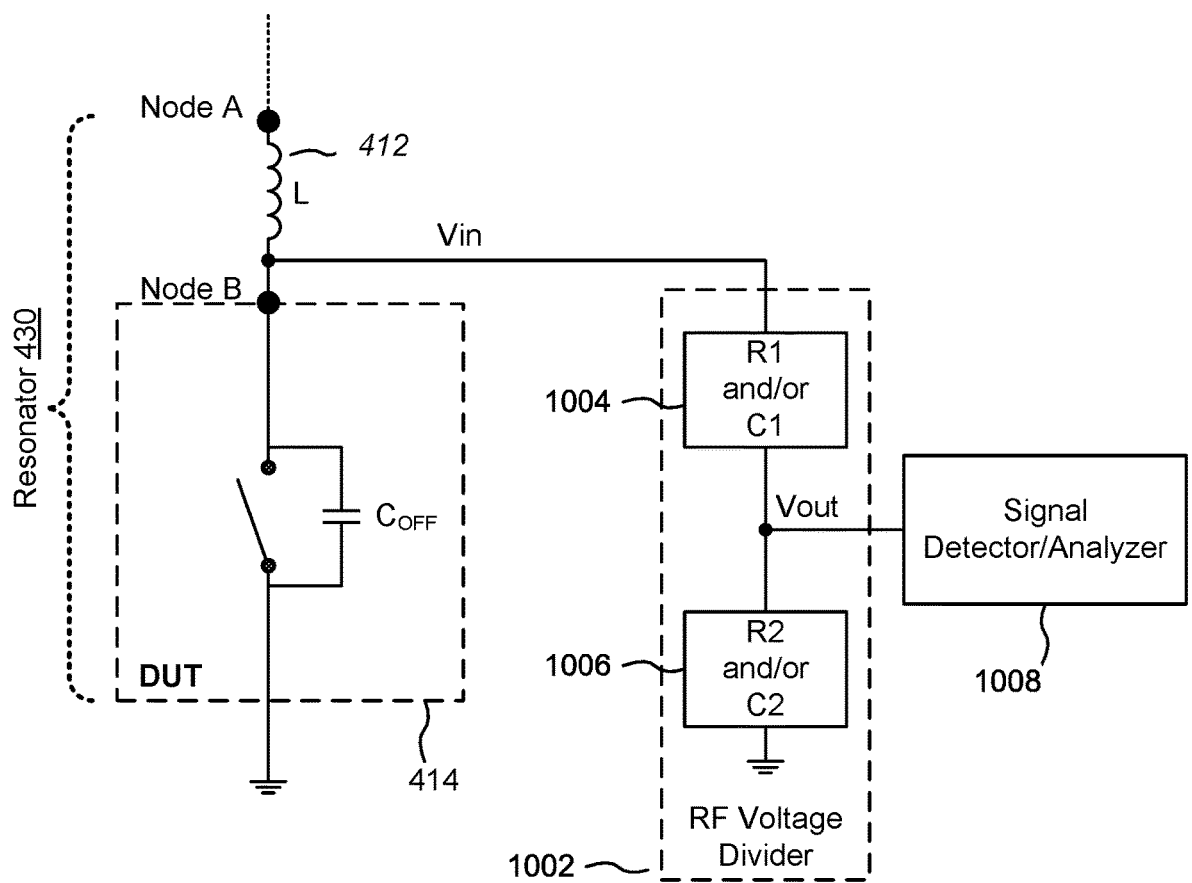
FIG. 10 is a schematic diagram of one auxiliary circuit that may be used in conjunction with test system embodiments similar to the embodiments shown in FIGS. 4A-4C.

It may be useful to add auxiliary circuits to the systems of the type shown in FIGS. 4A-4C. For example, FIG. 10 is a schematic diagram of one auxiliary circuit that may be used in conjunction with test system embodiments similar to the embodiments shown in FIGS. 4A-4C. In this example, a resistive or capacitive RF voltage divider 1002 is coupled between the inductor 412 and the DUT 414. In the illustrated example, the RF voltage divider 1002 comprises a first valued element 1004 (R1 or C1) and a second valued element 1006 (R2 or C2). As is known in the art, the output voltage Vout of the RF voltage divider 1002 will be proportional to the input voltage Vin, as determined by the ratios Vout=Vin*(R2/(R1+R2)) or Vout=Vin*(C1/(C1+C2)). Accordingly, the output of the RF voltage divider 1002, Vout, will be proportional to—and thus indicative of—the actual voltage being applied to the DUT 414. In practical implementations of the RF voltage divider 1002, it may be useful to use a combination of both resistors Rx and capacitors Cy; for example, the RF voltage divider 1002 may be formed by a parallel combination of resistors Rx and capacitors Cy for both the "top" first valued element 1004 and/or for the "bottom" second valued element 1006. This might be done to provide proper voltage division both at DC and at RF frequencies.

The proportional measurement of the actual voltage applied to the DUT 414 may be used for a variety of purposes. For example, as shown in FIG. 10, Vout may be coupled to at least one of a signal detector or analyzer 1008, such as a voltage detector or a time domain or frequency analyzer. The signal detector or analyzer 1008 may be used, for example, as part of a positive feedback loop during testing of a FET switch device (since it provides verification of actual applied DUT voltage), or to trigger protective circuitry (not shown) to prevent destruction of the DUT 414 during testing due to excessive voltage being applied to the DUT 414.

In some embodiments, the voltage divider 1002 and signal detector or analyzer 1008 may be fabricated on the same integrated circuit as the FET switch device under test. In such an embodiment, the protective function triggered by the signal detector or analyzer 1008 may be used not only to prevent destruction of the DUT 414 in the field, but also to protect other circuitry in an assembled product.

Benefits

Resonator-based test circuits encompassed by the invention are easily made from economical components (e.g., an extremely large high power amplifier is not needed), and are fast, accurate, and scalable. A resonator-based circuit test enables searches for the HKPs of FET switch devices under test using pulsed power transformed to a higher characteristic impedance, and thus avoids a requirement for high available power at a relatively low characteristic impedance that can damage a FET switch DUT. In addition to reducing the power level of the test system (and thus avoiding increased cost), in some embodiments, a resonator-based circuit also raises the voltage level of the harmonic reflected signal with respect to the system noise floor, making accurate measurement easier and decreasing test time.

Another benefit of a resonator-based test circuit is that it can detect when a DUT 414 is out of specification. If the expected $C_{OFF}$ capacitance of the FET switch device under test is not within specification, the resonator 430 will exhibit a significant shift in resonance and thus input impedance, which will change the expected S11 measurement (thus, a harmonic inflection point may not occur), indicating a faulty part.

Embodiments of the invention may be used in reliability burn-in systems to stress FET switch devices or accelerate lifetime degradation of FET switch devices under test, as well as for unit testing of FET switches as part of normal production. Such embodiments reduce the amount of input power required to provide during reliability burn-in tests, which reduces cost and allows for more parallel devices to be burned-in simultaneously.

Methods

Figure 11:
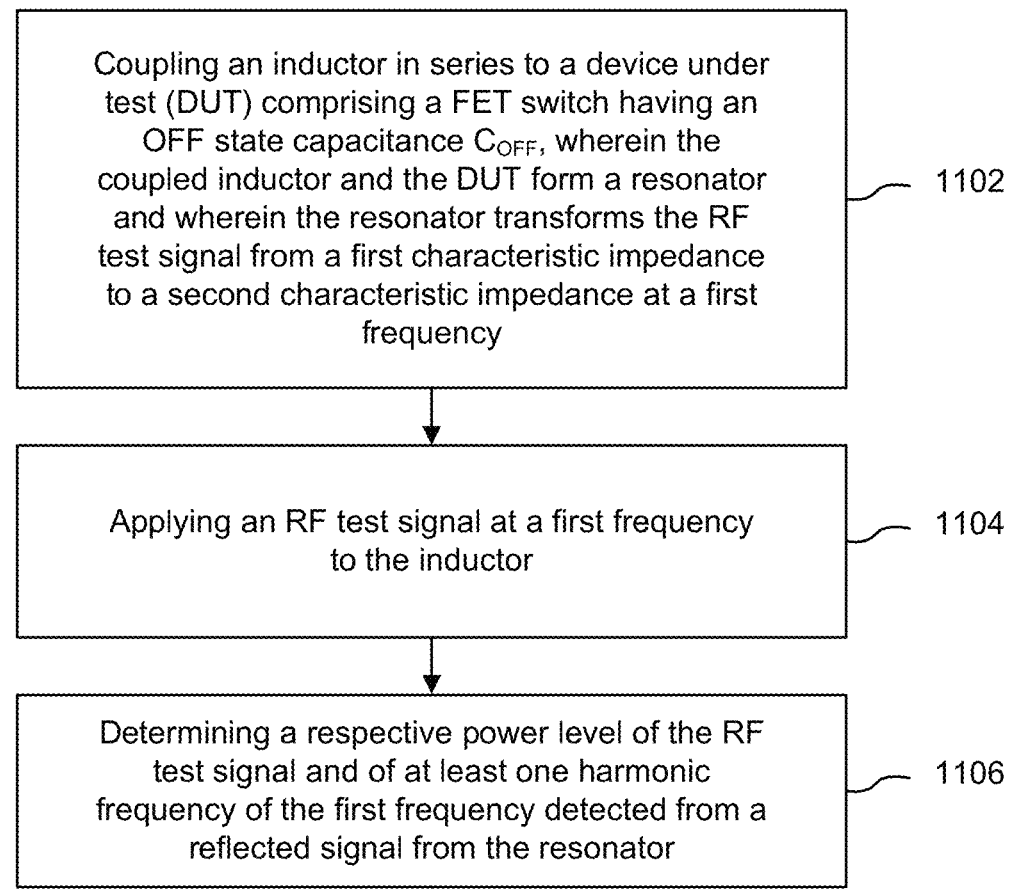
FIG. 11 is a process flowchart for a first method for testing RF FET switches.

Another aspect of the invention includes methods for testing radio frequency (RF) field-effect transistor (FET) switches. For example, FIG. 11 is a process flowchart 1100 for a first method for testing RF FET switches, including: coupling an inductor in series to a device under test (DUT) comprising a FET switch having an OFF state capacitance $C_{OFF}$, wherein the coupled inductor and the DUT form a resonator and wherein the resonator transforms the RF test signal from a first characteristic impedance to a second characteristic impedance at a first frequency [Block 1102]; applying an RF test signal at a first frequency to the inductor [Block 1104]; and determining a respective power level of the RF test signal and of at least one harmonic frequency of the first frequency detected from a reflected signal from the resonator [Block 1106].

Other aspects of the above method may include one or more of: wherein determining a power level of the at least one harmonic frequency includes determining a harmonic inflection point for the at least one harmonic frequency, wherein the harmonic inflection point indicates excessive non-linear distortion for the DUT; wherein the DUT when coupled has a first reactance, and the inductor has a second reactance selected such that an imaginary component of the second reactance of the inductor essentially offsets an imaginary component of the first reactance of the DUT; wherein a voltage of the RF test signal is stepped up by the resonator at the first frequency; wherein determining a power level of at least one harmonic frequency includes, in a first phase, increasing a power level of the RF test signal at a first rate and determining a first approximation of a harmonic inflection point for the at least one harmonic frequency, wherein the first approximation of the harmonic inflection point indicates a first range of power level for the DUT indicating excessive non-linear distortion, and, in a second phase, increasing the power level of the RF test signal at a second rate, the second rate being less than the first rate, wherein a starting value for the power level in the second phase is less than the first range of power level for the DUT and determining a second approximation of the harmonic inflection point for the at least one harmonic frequency, wherein the second approximation of the harmonic inflection point indicates a second range of power level for the DUT indicating excessive non-linear distortion; wherein the resonator has a Q factor of at least 20; further including generating the RF test signal in a signal generator and amplifying the RF test signal with a power amplifier coupled to the signal generator; wherein determining a respective power level includes coupling a signal representative of the RF test signal, and the at least one harmonic frequency, to at least one logarithmic amplifier having an output, and coupling at least one digitizer to the logarithmic amplifier for converting the output of the logarithmic amplifier to digital values; wherein determining a respective power level includes selectively switching (i) a coupled signal representative of the RF test signal and (ii) the at least one harmonic frequency, to a switched output, coupling the switched output to a logarithmic amplifier having an output, and coupling a digitizer to the logarithmic amplifier for converting the output of the logarithmic amplifier to digital values; wherein the RF test signal is pulsed; further including situating the inductor in close proximity to the DUT; further including situating the inductor in a test probe so as to be in close proximity to the DUT when coupled to the DUT; further including coupling a tuning capacitor in parallel with the inductor; further including coupling a tuning resistor in series with the inductor; and/or further including generating a signal at a node between the inductor and the DUT that is proportional to a voltage at the node, and coupling the generated signal to at least one of a signal detector or analyzer.

These methods reduces the amount of input power required to provide during reliability burn-in tests, which reduces cost and allows for more parallel devices to be burned-in simultaneously.

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this specification, the term "radio frequency" (RF) refers a rate of oscillation in the range of about 3 kHz to about 300 GHz. This term also includes the frequencies used in wireless communication systems. An RF frequency may be the frequency of an electromagnetic wave or of an alternating current in a circuit.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A system for testing radio frequency (RF) field-effect transistor (FET) switches, including:
   (a) test signal circuitry for generating an RF test signal at a first frequency;
   (b) an inductor having a first terminal series coupled to the test signal circuitry so as to receive the RF test signal and a second terminal configured to be series coupled to a device under test (DUT) comprising a FET switch having an OFF state capacitance $C_{OFF}$, wherein the inductor and the DUT form a resonator when coupled and wherein the resonator transforms the RF test signal from a first characteristic impedance to a second characteristic impedance at the first frequency;
   (c) measurement circuitry coupled to the test signal circuitry and the inductor, for determining a respective power level of the RF test signal and of at least one harmonic frequency of the first frequency detected from a reflected signal from the resonator.

2. The invention of claim 1, wherein determining a power level of the at least one harmonic frequency includes determining a harmonic inflection point for the at least one harmonic frequency, wherein the harmonic inflection point indicates excessive non-linear distortion for the DUT.

3. The invention of claim 1, wherein the DUT when coupled has a first reactance, and the inductor has a second reactance selected such that an imaginary component of the second reactance of the inductor essentially offsets an imaginary component of the first reactance of the DUT.

4. The invention of claim 1, wherein a voltage of the RF test signal is stepped up by the resonator at the first frequency.

5. The invention of claim 1, wherein determining a power level of at least one harmonic frequency includes:
   (a) in a first phase,
      (1) increasing a power level of the RF test signal at a first rate; and
      (2) determining a first approximation of a harmonic inflection point for the at least one harmonic frequency, wherein the first approximation of the harmonic inflection point indicates a first range of power level for the DUT indicating excessive non-linear distortion; and
   (b) in a second phase,
      (1) increasing the power level of the RF test signal at a second rate, the second rate being less than the first rate, wherein a starting value for the power level in the second phase is less than the first range of power level for the DUT; and
      (2) determining a second approximation of the harmonic inflection point for the at least one harmonic frequency, wherein the second approximation of the harmonic inflection point indicates a second range of power level for the DUT indicating excessive non-linear distortion.

6. The invention of claim 1, wherein the resonator has a Q factor of at least about 10.

7. The invention of claim 1, wherein the test signal circuitry includes a signal generator for generating the RF test signal, and a power amplifier coupled to the signal generator for amplifying the RF test signal.

8. The invention of claim 1, wherein the measurement circuitry includes:
   (a) at least one logarithmic amplifier configured to receive a coupled signal representative of the RF test signal, and the at least one harmonic frequency, and having an output; and (b) at least one digitizer coupled to the logarithmic amplifier for converting the output of the logarithmic amplifier to digital values.

9. The invention of claim 1, wherein the measurement circuitry includes:
   (a) a digital switch configured to receive as inputs (i) a coupled signal representative of the RF test signal and (ii) the at least one harmonic frequency, and to output a selected one of the inputs;
   (b) a logarithmic amplifier coupled to the digital switch and having an output; and
   (c) a digitizer coupled to the logarithmic amplifier for converting the output of the logarithmic amplifier to digital values.

10. The invention of claim 1, wherein the RF test signal is pulsed.

11. The invention of claim 1, wherein the inductor is situated in close proximity to the DUT when coupled to the DUT.

12. The invention of claim 1, wherein the inductor is situated in a test probe so as to be in close proximity to the DUT when coupled to the DUT.

13. The invention of claim 1, further including a tuning capacitor coupled in parallel with the inductor.

14. The invention of claim 1, further including a tuning resistor coupled in series with the inductor.

15. The invention of claim 1, further including:
   (a) an RF voltage divider configured to be coupled to a node between the inductor and the DUT, and having an output proportional to a voltage at the node; and
   (b) at least one of a signal detector or analyzer coupled to the output of the RF voltage divider.

16. A system for testing radio frequency (RF) field-effect transistor (FET) switches, including:
   (a) an inductor configured to be series coupled to a device under test (DUT) comprising a FET switch having an OFF state capacitance $C_{OFF}$, the inductor and the DUT forming a resonant circuit when coupled;
   (b) test signal circuitry for generating an RF test signal at a first frequency;
   (c) coupler and filter circuitry for coupling the RF test signal to the resonant circuit at a first characteristic impedance, receiving a reflected signal from the resonant circuit, filtering out from the reflected signal at least one harmonic frequency of the first frequency, and outputting the at least one harmonic frequency; and
   (d) measurement circuitry coupled to the test signal circuitry and to the coupler circuitry, for determining a respective power level of the RF test signal and of the at least one harmonic frequency;
   wherein the resonant circuit transforms the RF test signal from the first characteristic impedance to a second characteristic impedance at the first frequency.

17. A method for testing radio frequency (RF) field-effect transistor (FET) switches, including:
   (a) applying an RF test signal at a first frequency to a first terminal of an inductor;
   (b) coupling a second terminal of the inductor in series with a device under test (DUT) comprising a FET switch having an OFF state capacitance $C_{OFF}$, wherein the coupled inductor and the DUT form a resonator and wherein the resonator transforms the applied RF test signal from a first characteristic impedance to a second characteristic impedance at a first frequency; and
   (c) determining a respective power level of the RF test signal and of at least one harmonic frequency of the first frequency detected from a reflected signal from the resonator.

18. The method of claim 17, wherein determining a power level of the at least one harmonic frequency includes determining a harmonic inflection point for the at least one harmonic frequency, wherein the harmonic inflection point indicates excessive non-linear distortion for the DUT.

19. The method of claim 17, wherein the DUT when coupled has a first reactance, and the inductor has a second reactance selected such that an imaginary component of the second reactance of the inductor essentially offsets an imaginary component of the first reactance of the DUT.

20. The method of claim 17, wherein determining a power level of at least one harmonic frequency includes:
   (a) in a first phase,
      (1) increasing a power level of the RF test signal at a first rate; and
      (2) determining a first approximation of a harmonic inflection point for the at least one harmonic frequency, wherein the first approximation of the harmonic inflection point indicates a first range of power level for the DUT indicating excessive non-linear distortion; and
   (b) in a second phase,
      (1) increasing the power level of the RF test signal at a second rate, the second rate being less than the first rate, wherein a starting value for the power level in the second phase is less than the first range of power level for the DUT; and
      (2) determining a second approximation of the harmonic inflection point for the at least one harmonic frequency, wherein the second approximation of the harmonic inflection point indicates a second range of power level for the DUT indicating excessive non-linear distortion.

* * * * *